(12) United States Patent
Prushinskiy et al.

(10) Patent No.: US 9,824,910 B2
(45) Date of Patent: Nov. 21, 2017

(54) ELECTROSTATIC CHUCK

(71) Applicant: Samsung Display Co., Ltd., Yongin, Gyeonggi-Do (KR)

(72) Inventors: Valeriy Prushinskiy, Hwaseong-si (KR); Min Soo Kim, Seoul (KR); Sok Won Noh, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 156 days.

(21) Appl. No.: 14/740,799

(22) Filed: Jun. 16, 2015

(65) Prior Publication Data

US 2016/0126124 A1 May 5, 2016

(30) Foreign Application Priority Data

Nov. 5, 2014 (KR) .......................... 10-2014-0153048

(51) Int. Cl.
*H01L 21/683* (2006.01)

(52) U.S. Cl.
CPC ......... *H01L 21/6833* (2013.01); *Y10T 279/23* (2015.01)

(58) Field of Classification Search
CPC ............. H01L 21/6833; H01L 21/6831; Y10T 279/23
See application file for complete search history.

(56) References Cited

U.S. PATENT DOCUMENTS

| | | | | |
|---|---|---|---|---|
| 5,572,398 A * | 11/1996 | Federlin | ................. | H02N 13/00 361/234 |
| 6,129,806 A * | 10/2000 | Kaji | ................. | H01J 37/32678 118/723 E |
| 6,245,190 B1 * | 6/2001 | Masuda | ............ | H01J 37/32082 118/723 MA |
| 6,335,534 B1 * | 1/2002 | Suguro | ............... | H01J 37/3171 250/423 R |
| 6,416,618 B2 * | 7/2002 | Tsuchihashi | ........ | C23C 16/4586 118/723 E |
| 7,394,640 B2 * | 7/2008 | Hayakawa | .......... | H01L 21/6833 279/128 |
| 7,457,097 B2 | 11/2008 | Bain et al. | | |
| 7,772,567 B2 * | 8/2010 | Kato | ...................... | G01N 23/04 250/440.11 |
| 8,196,594 B2 * | 6/2012 | Harano | ..................... | B08B 6/00 134/133 |

(Continued)

FOREIGN PATENT DOCUMENTS

JP 2000149845 A * 5/2000
JP 2003243493 A * 8/2003

(Continued)

*Primary Examiner* — Eric A Gates
(74) *Attorney, Agent, or Firm* — Knobbe Martens Olson & Bear LLP

(57) ABSTRACT

An electrostatic chuck is disclosed. In one aspect, the electrostatic chuck includes a top plate, wherein first and second regions adjacent to each other are formed at a surface of the top plate. The electrostatic chuck also includes a first absorption plate positioned at the first region and a second absorption plate positioned at the second region to be separated from the first absorption plate. The first and second absorption plates are configured to support the absorption target.

17 Claims, 5 Drawing Sheets

(56) References Cited

U.S. PATENT DOCUMENTS

| | | | | |
|---|---|---|---|---|
| 8,238,072 B2* | 8/2012 | Fujisawa | ................ | H02N 13/00 |
| | | | | 361/234 |
| 9,240,339 B2* | 1/2016 | Maeda | .............. | H01L 21/67742 |
| 9,245,716 B2* | 1/2016 | de la Llera | ....... | H01J 37/32091 |
| 9,427,949 B2* | 8/2016 | Ohno | .................... | B32B 43/006 |
| 9,472,434 B2* | 10/2016 | Cox | ................. | H01L 21/67103 |
| 2010/0188794 A1 | 7/2010 | Park et al. | | |
| 2013/0201596 A1* | 8/2013 | Chen | .................. | H01L 21/6831 |
| | | | | 361/234 |

FOREIGN PATENT DOCUMENTS

| | | |
|---|---|---|
| KR | 10-2013-0082143 A | 7/2013 |
| KR | 10-2013-0089565 A | 8/2013 |

* cited by examiner

ELECTROSTATIC CHUCK

CROSS-REFERENCE TO RELATED APPLICATION

This application claims priority to and the benefit of Korean Patent Application No. 10-2014-0153048 filed in the Korean Intellectual Property Office on Nov. 5, 2014, the entire contents of which are incorporated herein by reference.

BACKGROUND

Field

The described technology generally relates to an electrostatic chuck.

Description of the Related Technology

In general, an electrostatic chuck is used to absorb and support an absorption target by using a static electricity force. The electrostatic chuck absorbs and supports a substrate such as a glass substrate in a manufacturing process of a semiconductor or a display device, and the like.

Recently, as large-sized displays are used, glass substrates for the displays become large, requiring a larger electrostatic chuck.

SUMMARY OF CERTAIN INVENTIVE ASPECTS

One inventive aspect is an electrostatic chuck supporting a substrate such as a glass substrate.

Another aspect is an electrostatic chuck that easily absorbs and supports a glass substrate with a large area.

Another aspect is an electrostatic chuck that includes: a top plate; a first absorption plate positioned at a first region among the first region and a second region adjacent to each other at a surface of the top plate and supporting an absorption target; and a second absorption plate positioned at the second region to be separated from the first absorption plate and supporting the absorption target.

The first region and the second region may be divided with reference to the center of the surface of the top plate.

A center of the surface of the top plate may be exposed at a separation space between the first absorption plate and the second absorption plate.

One portion of the first absorption plate may be supported by the other portion of the first absorption plate to be rotated.

The first absorption plate may include a first rotation axis connecting one portion and the other portion.

The first absorption plate may set a range of the rotation of the one portion, and may include a first stopper formed at one among one portion and the other portion of the first absorption plate.

The second absorption plate may be fixed to the top plate.

One portion of the second absorption plate may be supported by the other portion of the second absorption plate to be rotated.

The second absorption plate may include a second rotation axis connecting between the one portion and the other portion.

The second absorption plate may set a range of the rotation of the one portion, and may include a second stopper formed at one among one portion and the other portion of the second absorption plate.

The absorption target may be a glass substrate.

Another aspect is an electrostatic chuck comprising: a top plate, wherein first and second regions adjacent to each other are formed at a surface of the top plate; a first absorption plate positioned at the first region; and a second absorption plate positioned at the second region to be separated from the first absorption plate, wherein the first and second absorption plates are configured to support the absorption target.

In the above electrostatic chuck, the first and second regions are divided with reference to the center of the surface of the top plate. In the above electrostatic chuck, a gap is formed between the first and second absorption plates such that the center of the surface of the top plate is not covered by the first and second absorption plates. In the above electrostatic chuck, the first absorption plate includes a first portion and a second portion different from the first portion, wherein the second portion is configured to at least partially rotate, and wherein the first portion is configured to support the second portion while the second portion is being rotated. In the above electrostatic chuck, a first rotation axis is formed in the first portion of the first absorption plate, and wherein the second portion of the first absorption plate is configured to at least partially rotate about the first rotation axis. In the above electrostatic chuck, the first rotation axis is formed to be adjacent to an end of the first absorption plate.

In the above electrostatic chuck, the first absorption plate includes a first stopper configured to set a range of the rotation of the second portion. In the above electrostatic chuck, the first stopper is formed on the second portion of the first absorption plate. In the above electrostatic chuck, the first stopper is formed to be adjacent to the center of the surface of the top plate. In the above electrostatic chuck, the second absorption plate is fixed to the surface of the top plate. In the above electrostatic chuck, the second absorption plate includes a third portion and a fourth portion different from each other, wherein the fourth portion is configured to at least partially rotate, and wherein the third portion is configured to support the fourth portion while the fourth portion is being rotated. In the above electrostatic chuck, a second rotation axis is formed in the third portion, and wherein the fourth portion is configured to at least partially rotate about the second rotation axis. In the above electrostatic chuck, the second absorption plate includes a second stopper configured to set a range of the rotation of the fourth portion.

In the above electrostatic chuck, the second stopper is formed on the fourth portion. In the above electrostatic chuck, the second stopper is formed to be adjacent to the center of the surface of the top plate. In the above electrostatic chuck, the absorption target is a glass substrate. In the above electrostatic chuck, the combined length of the first and second absorption plates is less than that of the top plate. In the above electrostatic chuck, the length of each of the first and second absorption plates is less than half that of the top plate. In the above electrostatic chuck, the top plate is thicker than each of the first and second absorption plates.

Another aspect is an electrostatic chuck comprising: a main plate including a surface, wherein the surface is divided into first and second regions neighboring each other; a first absorption plate positioned at the first region; and a second absorption plate positioned at the second region to be separated from the first absorption plate, wherein the first and second absorption plates are configured to support an absorption target, and wherein at least one of the first and second absorption plates is configured to at least partially rotate.

At least one of the disclosed embodiments provides an electrostatic chuck easily absorbing and supporting the glass substrate with a large area.

DETAILED DESCRIPTION OF CERTAIN INVENTIVE EMBODIMENTS

Figure 1:
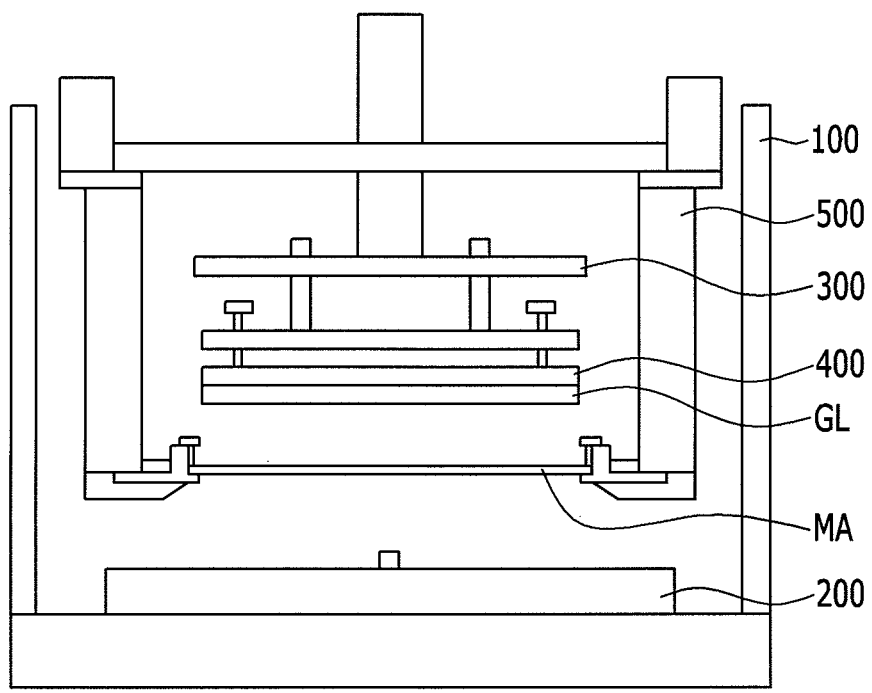
FIG. 1 is a view showing an organic material deposition device including an electrostatic chuck according to an exemplary embodiment.

The described technology will be described more fully hereinafter with reference to the accompanying drawings, in which exemplary embodiments of the invention are shown. As those skilled in the art would realize, the described embodiments may be modified in various different ways, all without departing from the spirit or scope of the present invention. The same elements or equivalents are referred to by the same reference numerals throughout the specification.

Further, in exemplary embodiments, since like reference numerals designate like elements having the same configuration, a first exemplary embodiment is representatively described, and in other exemplary embodiments, only configurations different from the first exemplary embodiment will be described.

In addition, the size and thickness of each element shown in the drawings are arbitrarily shown for better understanding and ease of description, but the present invention is not limited thereto.

In the drawings, the thickness of layers, films, panels, regions, etc., may be exaggerated for clarity. In the drawings, for better understanding and ease of description, the thicknesses of some layers and areas may be exaggerated. It will be understood that when an element such as a layer, film, region, or substrate is referred to as being "on" another element, it can be directly on the other element or intervening elements may also be present.

In addition, in the specification, the word "~on" means positioning above or below the object portion, but does not essentially mean positioning on the upper side of the object portion based on a gravity direction. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Now, an electrostatic chuck according to an exemplary embodiment will be described with reference to FIG. 1 and FIG. 2. Hereinafter, a glass substrate is one example as an absorption target absorbed or supported by the electrostatic chuck, however it is not limited thereto, and the absorption target may include a metal, an inorganic material, or an organic material.

FIG. 1 is a view showing an organic material deposition device including an electrostatic chuck according to an exemplary embodiment. In FIG. 1, for convenience of the description, the electrostatic chuck is shown with a flat shape, but the electrostatic chuck shown in FIG. 1 may have a shape of an electrostatic chuck shown in FIG. 2.

As shown in FIG. 1, an electrostatic chuck according to an exemplary embodiment is included in an organic material deposition device depositing an organic material formed as an organic emission layer of an organic light emitting device to a glass substrate GL.

The organic material deposition device 1000 includes a chamber 100, an evaporation source 200, a chuck holder 300, an electrostatic chuck 400, and a mask holder 500.

The chamber 100 may maintain a vacuum state, and a glass substrate GL and a mask MA are respectively supported by the chuck holder 300 and the mask holder 500 in the chamber 100.

The evaporation source 200 evaporates an organic material as the organic emission layer to the glass substrate GL. The organic material evaporated from the evaporation source 200 is deposited to the glass substrate GL through the mask MA, and the deposited organic material may be formed as the organic emission layer.

The chuck holder 300 supports the electrostatic chuck 400 and moves in a predetermined direction to move the electrostatic chuck 400.

The electrostatic chuck 400 absorbs and supports the glass substrate GL by using static electricity force. A detailed configuration of the electrostatic chuck 400 will be described later.

The mask holder 500 supports the mask MA, and when the mask MA is a fine metal mask (FMM), it may support the mask MA to be extended. The mask holder 500 may move in the predetermined direction to control an interval between the mask MA and the glass substrate GL.

As described above, the organic material deposition device 1000 deposits the organic material evaporated from the evaporation source 200 to the glass substrate GL by using the mask MA, thereby forming the organic emission layer on the glass substrate GL.

Figure 2:
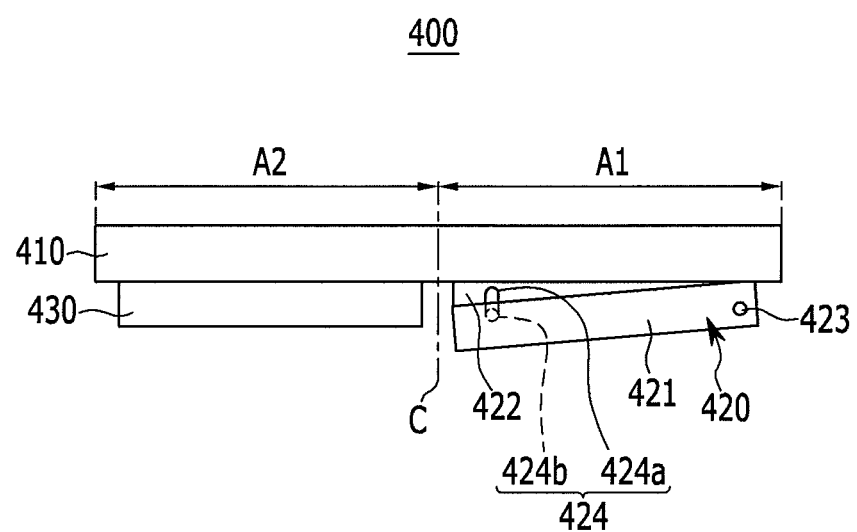
FIG. 2 is a cross-sectional view of an electrostatic chuck according to an exemplary embodiment.

FIG. 2 is a cross-sectional view of the electrostatic chuck shown in FIG. 1 according to an exemplary embodiment.

In some embodiments, as shown in FIG. 2, the electrostatic chuck 400 absorbs the absorption target such as the glass substrate by using the static electricity force, and includes a top or supporting plate 410, a first absorption plate 420, and a second absorption plate 430.

The top plate 410 may be a portion supported by the above-described chuck holder, and includes a first region A1 and a second region A2 divided with reference to a center C of the surface and adjacent to each other. The top plate 410 may have a polygonal shape such as a triangle, a quadrangle, a pentagon, a hexagon, a heptagon, and an octagon in a plane, or may have a shape such as a circle or an oval.

The first absorption plate 420 is positioned at the first region A1 of the top plate 410 to be supported by the top plate 410, and absorbs and supports the absorption target. The first absorption plate 420 is separated from the second absorption plate 430 via a separation space. The center C of the surface of the top plate 410 is exposed at the separation space between the first and second absorption plates 420 and 430. The first absorption plate 420 may have a polygonal shape such as a triangle, a quadrangle, a pentagon, a hexagon, a heptagon, and an octagonal shape in a plane, or may have a circular or oval shape.

The first absorption plate 420 includes a first portion 421 of one portion, a second portion 422 of another portion, a first rotation axis 423, and a first stopper 424. The first portion 421 of the first absorption plate 420 may be one portion of the entire first absorption plate 420, and the second portion 422 may be the rest of the first absorption plate 420. On the other hand, in an exemplary embodiment, the first portion 421 is rotated, however the described technology is not limited thereto, and the entire first absorption plate 420 may be rotated with reference to the top plate 410.

The first portion 421 is supported by the second portion 422 to be rotated, and the first and second portions 421 and 422 are connected by the first rotation axis 423.

The second portion 422 is supported by the top plate 410, and is connected to the first portion 421 by the first rotation axis 423. The rotation of the first portion 421 or the second portion 422 may be performed by a driver including a motor (not shown) mounted on at least one of the first and second portions 421 and 422.

The first rotation axis 423 connects between the first and second portions 421 and 422, and the first portion 421 is rotated with reference to the first rotation axis 423. By rotating the first portion 421 with respect to the first rotation axis 423, one end of the first portion 421 near the first rotation axis 423 is supported by the second portion 422 and the other end of the first portion 421 far from the first rotation axis 423 may be moved in a lower direction in FIG. 2.

The first stopper 424 sets a rotation range of the first portion 421, and can be formed on at least one of the first and second portions 421 and 422. The first stopper 424 may include a first protrusion 424b protruded at one of the first and second portions 421 and 422, and a first rotation guide unit 424a depressed at the other one. If the first portion 421 is rotated, the first protrusion 424b is moved along with the first rotation guide unit 424a, and if the first protrusion 424b is moved to the end of the first rotation guide unit 424a, the first protrusion 424b is stopped by the end of the first rotation guide unit 424a such that the rotation of the first portion 421 is stopped.

A patterned absorption electrode may be positioned in the first absorption plate 420. When a high voltage is applied to the absorption electrode of the first absorption plate 420, a potential difference is generated between the first absorption plate 420 and an absorption member. The potential difference generates the static electricity force between the absorption target and the first absorption plate 420 such that the absorption target is absorbed to the surface of the first absorption plate 420. In contrast, when the high voltage applied to the absorption electrode is stopped, the static electricity force between the first absorption plate 420 and the absorption member is eliminated such that the absorption target may be separated from the first absorption plate 420.

The second absorption plate 430 is separated from the first absorption plate 420, is positioned at the second region A2 of the top plate 410, and absorbs and supports the absorption target. The second absorption plate 430 is fixed to the top plate 410. The second absorption plate 430 may have a polygonal shape such as a triangle, a quadrangle, a pentagon, a hexagon, a heptagon, and an octagonal shape in a plane or may have a circular or oval shape.

The patterned absorption electrode may be positioned in the second absorption plate 430. When the high voltage is applied to the absorption electrode of the second absorption plate 430, the potential difference is generated between the second absorption plate 430 and the absorption member. The potential difference generates the static electricity force between the absorption target and the second absorption plate 430, thereby absorbing the absorption target to the surface of the second absorption plate 430. In contrast, when the high voltage applied to the absorption electrode is stopped, the static electricity force between the second absorption plate 430 and the absorption member is eliminated such that the absorption target may be separated from the second absorption plate 430.

Next, the absorption of the absorption target using the electrostatic chuck according to an exemplary embodiment will be described with reference to FIG. 3. Hereinafter, the glass substrate is one example of the absorption target absorbed or supported by the electrostatic chuck, but it is not limited thereto, and the absorption target may include the metal, the inorganic material, or the organic material.

Figure 3:
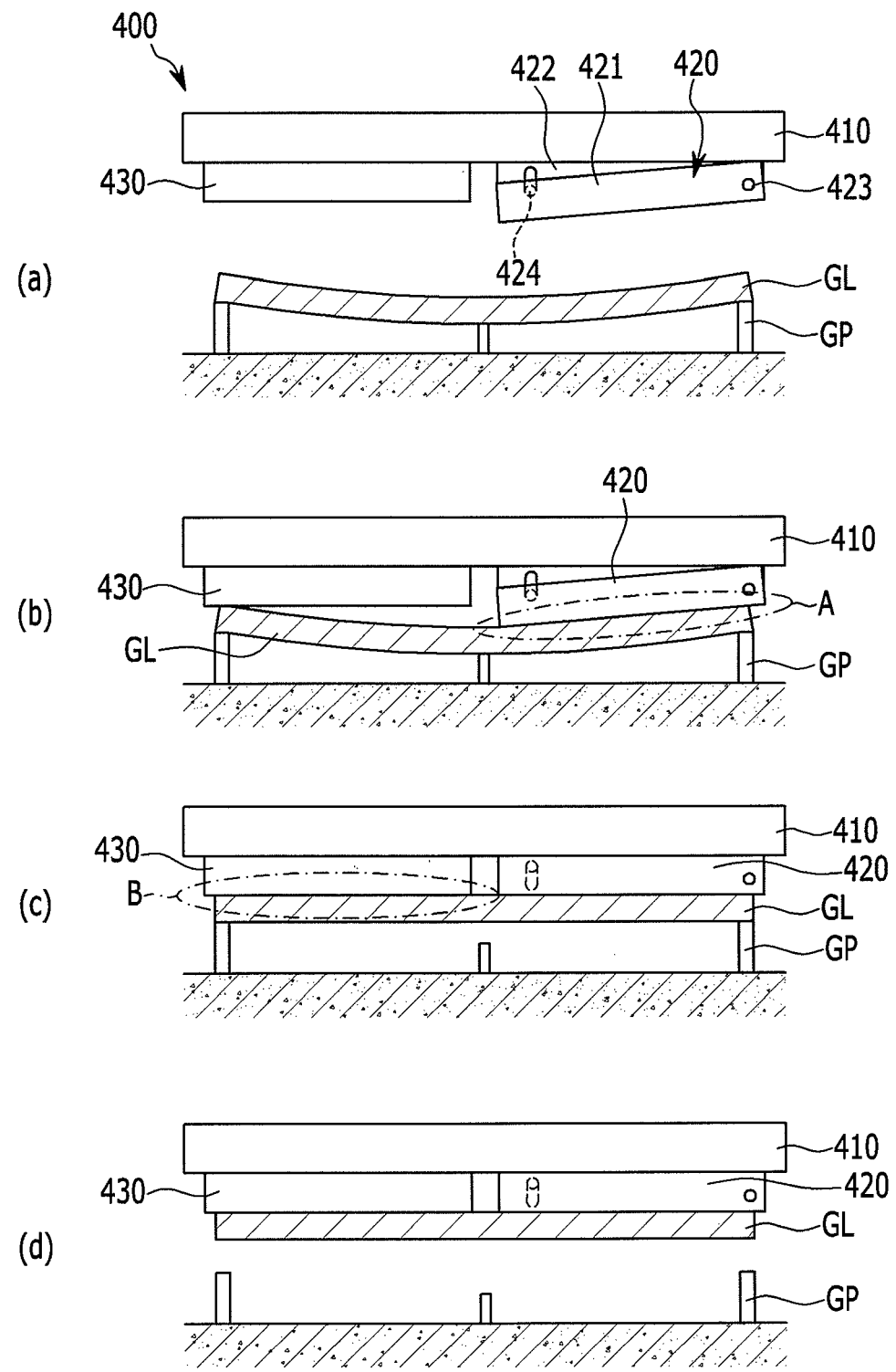
FIG. 3 is a view showing absorption of a glass substrate by using an electrostatic chuck according to an exemplary embodiment.

FIG. 3 is a view showing absorption of a glass substrate by using an electrostatic chuck according to an exemplary embodiment.

Firstly, as shown in FIG. 3 (a), the electrostatic chuck 400 is moved to the side of the glass substrate GL of the large area supported by a glass supporter GP. In this case, since the glass substrate GL has the large area, the glass substrate GL is supported by the glass supporter GP in the state that the center portion of the glass substrate GL is curved to the lower side. After moving the electrostatic chuck 400 to the side of the glass substrate GL, the first portion 421 of the first absorption plate 420 is rotated in the direction of the glass substrate GL.

Next, as shown in FIG. 3 (b), the first portion 421 of the first absorption plate 420 absorbs one portion A of the glass substrate GL.

As shown in FIG. 3 (c), if the first portion 421 of the first absorption plate 420 in which one portion A of the glass substrate GL is absorbed is moved in the direction of the top plate 410, the glass substrate GL in which one portion A is absorbed to the first portion 421 is then moved in the direction of the second portion 422 of the first absorption plate 420 according to the rotation of the first portion 421. While the glass substrate GL is moved in the direction of the second portion 422 of the first absorption plate 420, one portion A of the glass substrate GL facing the first absorption plate 420 is firstly absorbed to the first absorption plate 420, and the rest of the portion B of the glass substrate GL facing the second absorption plate 430 is secondly absorbed to the second absorption plate 430.

In this case, while the one portion A facing the first absorption plate 420 among the entire portion of the glass substrate GL is absorbed to the first absorption plate 420 according to the rotation of the first portion 421 of the first absorption plate 420, the center portion of the glass substrate GL is bent. Furthermore, since the rest of the portion B facing the second absorption plate 430 among the entire portion of the glass substrate GL is secondly absorbed to the second absorption plate 430 by the self-elastic restoring force of the glass substrate GL and the static electricity between the second absorption plate 430 and the glass substrate GL, the center portion of the glass substrate GL absorbed to the electrostatic chuck 400 is not loosened at the lower side and is absorbed and supported by the electrostatic chuck 400 in the flat state.

Next, as shown in FIG. 3 (d), the glass substrate GL is separated from the glass supporter GP by moving the electrostatic chuck 400.

Subsequently, the patterning may be performed to the glass substrate GL of the absorption target that is absorbed and supported by the electrostatic chuck 400 by using a manufacturing process such as the organic material deposition process.

As described above, the electrostatic chuck according to an exemplary embodiment includes the top plate 410, and the first absorption plate 420 and the second absorption plate 430 that are divided from each other, such that the absorption target such as the glass substrate GL of the large area may be easily absorbed and supported. Particularly, although the glass substrate GL of the absorption target has a large area, since the first absorption plate 420 is rotated to firstly absorb and support one portion of the glass substrate GL and the remaining portion of the glass substrate GL is absorbed and supported by the second absorption plate 430, the center portion of the glass substrate GL absorbed and supported by the electrostatic chuck 400 and having the large area is suppressed from being loosened.

As described above, the electrostatic chuck 400 easily absorbing and supporting the glass substrate GL of the large area is provided.

Next, the electrostatic chuck according to another exemplary embodiment will be described with reference to FIG. 4. Hereinafter, only differences from the electrostatic chuck according to the above exemplary embodiment will be described.

Figure 4:
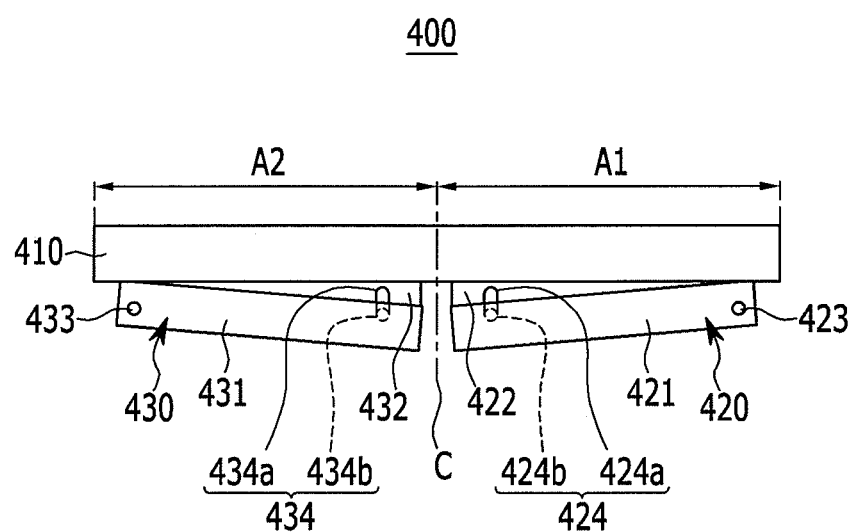
FIG. 4 is a cross-sectional view of an electrostatic chuck according to another exemplary embodiment.

FIG. 4 is a cross-sectional view of an electrostatic chuck according to another exemplary embodiment of the present invention.

As shown in FIG. 4, the electrostatic chuck 400 according to the current exemplary embodiment absorbs the absorption target such as the glass substrate by using the static electricity force, and includes the top plate 410, the first absorption plate 420, and the second absorption plate 430.

The second absorption plate 430 is positioned at the second region A2 of the top plate 410 to be supported by the top plate 410 and absorbs and supports the absorption target. The second absorption plate 430 is separated from the first absorption plate 420 through the separation space. The center C of the surface of the top plate 410 is exposed at the separation space between the first absorption plate 420 and the second absorption plate 430.

The second absorption plate 430 includes a third portion 431 as one portion, a fourth portion 432 as the other portion, a second rotation axis 433, and a second stopper 434. The third portion 431 of the second absorption plate 430 may be one portion of the entire second absorption plate 430, and the fourth portion 432 may be the remaining portion of the second absorption plate 430. The third portion 431 can be rotated, but the described technology is not limited thereto, and the entire second absorption plate 430 may be rotated with reference to the top plate 410.

The third portion 431 is supported by the fourth portion 432 to be rotated, and the third portion 431 is connected to the fourth portion 432 by the second rotation axis 433.

The fourth portion 432 is supported by the top plate 410 and is connected to the third portion 431 by the second rotation axis 433. The rotation of the third portion 431 for the fourth portion 432 may be performed by a driver including a motor (not shown) mounted on at least one of the first and second portions 421 and 422.

The second rotation axis 433 connects between the third and fourth portions 431 and 432, and the third portion 431 is rotated with reference to the second rotation axis 433. By rotating the third portion 431 with respect to the second rotation axis 433, one end of the third portion 431 close to the second rotation axis 433 is supported by the fourth portion 432 and the other end of the third portion 431 far from the second rotation axis 433 may be moved in the lower direction in FIG. 3.

The second stopper 434 sets the rotation range of the third portion 431 and is formed on at least one of the third and fourth portions 431 and 432. The second stopper 434 may include a second protrusion 434b protruding from one of the third and fourth portions 431 and 432 and a second rotation guide unit 434a formed to be depressed at the other of the third and fourth portions 431 and 432. If the third portion 431 is rotated, the second protrusion 434b is moved along with the second rotation guide unit 434a, and if the second protrusion 434b is moved to the end of the second rotation guide unit 434a, the second protrusion 434b is stopped by the end of the second rotation guide unit 434a, thereby stopping the rotation of the third portion 431.

The patterned absorption electrode may be positioned in the second absorption plate 430. When the high voltage is applied to the absorption electrode of the second absorption plate 430, the potential difference is generated between the second absorption plate 430 and the absorption member. The potential difference generates the static electricity force between the absorption target and the second absorption plate 430, and the absorption target is absorbed to the surface of the second absorption plate 430. In contrast, when the high voltage applied to the absorption electrode is stopped, the static electricity force generated between the second absorption plate 430 and the absorption member may be eliminated such that the absorption target may be separated from the second absorption plate 430.

Next, the absorption of the absorption target using the electrostatic chuck according to another exemplary embodiment will be described with reference to FIG. 5. Hereinafter, the glass substrate is one example of the absorption target absorbed or supported by the electrostatic chuck, however the described technology is not limited thereto, and the absorption target may include the metal, the inorganic material, or the organic material.

Figure 5:
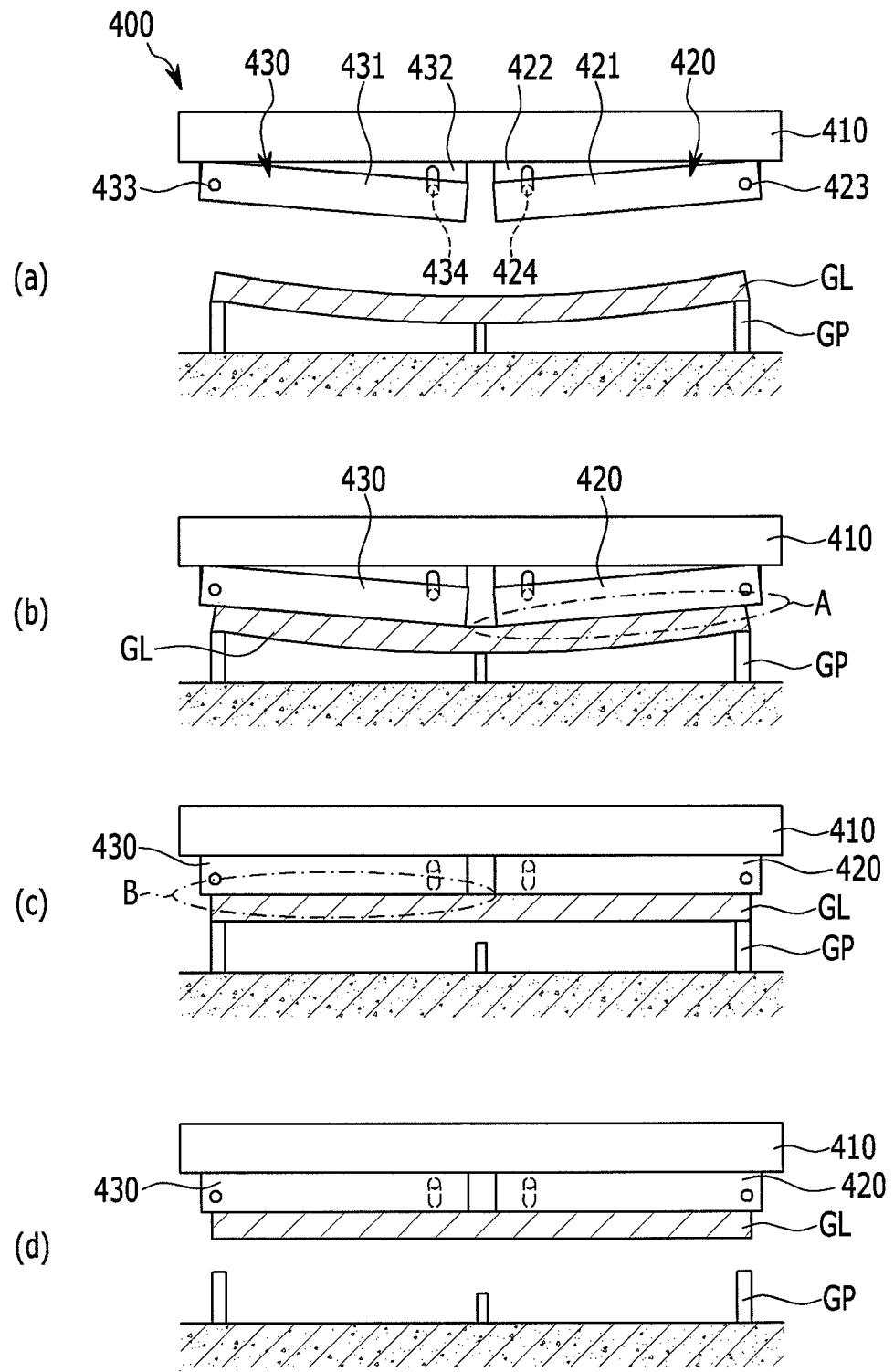
FIG. 5 is a view showing absorption of a glass substrate by using an electrostatic chuck according to another exemplary embodiment.

FIG. 5 is a view showing absorption of a glass substrate by using an electrostatic chuck according to another exemplary embodiment of the present invention.

Firstly, as shown in FIG. 5 (a), the electrostatic chuck 400 is moved in the side of the glass substrate GL of a large area supported by a glass supporter GP. In this case, since the glass substrate GL has a large area, the glass substrate GL is supported by the glass supporter GP in the state that the center portion of the glass substrate GL is curved to the lower side. After moving the electrostatic chuck 400 in the side of the glass substrate GL, the first portion 421 of the first absorption plate 420 and the third portion 431 of the second absorption plate 430 are rotated in the direction of the glass substrate GL.

Next, as shown in FIG. 5 (b), the first portion 421 of the first absorption plate 420 of the first absorption plate 420 and the third portion 431 of the second absorption plate 430 respectively absorb one portion A and the rest of the portion B of the glass substrate GL.

Next, as shown in FIG. 5 (c), if the first portion 421 of the first absorption plate 420 and the third portion 431 of the second absorption plate 430 absorbed with one portion A and the rest of the portion B of the glass substrate GL are rotated in the direction of the top plate 410, the glass substrate GL respectively absorbed with the first portion 421 and the third portion 431 is rotated in the direction of the second portion 422 of the first absorption plate 420 and the fourth portion 432 of the second absorption plate 430 according to each rotation of the first portion 421 and the third portion 431. While the glass substrate GL is rotated in the direction of the second portion 422 of the first absorption plate 420 and the fourth portion 432 of the second absorption plate 430, one portion A of the glass substrate GL facing the first absorption plate 420 is absorbed to the first absorption plate 420 and simultaneously the rest of, the portion B of the glass substrate GL facing the second absorption plate 430 is absorbed to the second absorption plate 430.

Next, as shown in FIG. 5 (d), the glass substrate GL is separated from the glass supporter GP by moving the electrostatic chuck 400.

Subsequently, the patterning may be performed to the glass substrate GL of the absorption target that is absorbed and supported by the electrostatic chuck 400 by using a manufacturing process such as the organic material deposition process.

As described above, the electrostatic chuck according to at least one of the disclosed embodiments includes the top plate 410 and the second absorption plate 430 separated from each other and substantially simultaneously and respectively rotated, such that the absorption target such as the glass substrate GL with the large area may be easily absorbed and supported.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrostatic chuck comprising:
a top plate, wherein first and second regions adjacent to each other are formed at a surface of the top plate;
a first absorption plate positioned at the first region; and
a second absorption plate positioned at the second region to be separated from the first absorption plate,
wherein the first and second absorption plates are configured to support an absorption target,
wherein the first absorption plate includes a first portion and a second portion, wherein the first portion is configured to at least partially rotate, wherein the second portion is configured to support the first portion while the first portion is being rotated,
wherein the second absorption plate includes a third portion and a fourth portion different from each other, wherein the third portion is configured to at least partially rotate, and wherein the fourth portion is configured to support the third portion while the third portion is being rotated.

2. The electrostatic chuck of claim 1, wherein the first and second regions are divided with reference to the center of the surface of the top plate.

3. The electrostatic chuck of claim 2, wherein a gap is formed between the first and second absorption plates such that the center of the surface of the top plate is not covered by the first and second absorption plates.

4. A The electrostatic chuck of claim 1, wherein the first absorption plate includes a first rotation axis connecting between the first portion and the second portion.

5. A The electrostatic chuck of claim 4, wherein the first rotation axis is formed to be adjacent to an end of the first absorption plate.

6. A The electrostatic chuck of claim 1, wherein the first absorption plate includes a first stopper configured to set a range of the rotation of the first portion.

7. The electrostatic chuck of claim 6, wherein the first stopper is formed on the first portion of the first absorption plate.

8. The electrostatic chuck of claim 7, wherein the first stopper is formed to be adjacent to the center of the surface of the top plate.

9. A The electrostatic chuck of claim 1, wherein the second absorption plate includes a second rotation axis connecting between the third portion and fourth portion.

10. A The electrostatic chuck of claim 1, wherein the second absorption plate includes a second stopper configured to set a range of the rotation of the third portion.

11. The electrostatic chuck of claim 10, wherein the second stopper is formed on the third portion.

12. The electrostatic chuck of claim 11, wherein the second stopper is formed to be adjacent to the center of the surface of the top plate.

13. The electrostatic chuck of claim 1, wherein the absorption target is a glass substrate.

14. The electrostatic chuck of claim 1, wherein the combined length of the first and second absorption plates is less than that of the top plate.

15. The electrostatic chuck of claim 1, wherein the length of each of the first and second absorption plates is less than half that of the top plate.

16. The electrostatic chuck of claim 1, wherein the top plate is thicker than each of the first and second absorption plates.

17. An electrostatic chuck comprising:
a main plate including a surface, wherein the surface is divided into first and second regions neighboring each other;
a first absorption plate positioned at the first region; and
a second absorption plate positioned at the second region to be separated from the first absorption plate,
wherein the first and second absorption plates are configured to support an absorption target, and wherein at least one of the first and second absorption plates is configured to at least partially rotate,
wherein the first absorption plate includes a first portion and a second portion wherein the first portion is configured to at least partially rotate, wherein the second portion is configured to support the first portion while the first portion is being rotated,
wherein the second absorption plate includes a third portion and a fourth portion different from each other, wherein the third portion is configured to at least partially rotate, and wherein the fourth portion is configured to support the third portion while the third portion is being rotated.

* * * * *